United States Patent [19]
Coffman et al.

[11] Patent Number: 5,636,162
[45] Date of Patent: Jun. 3, 1997

[54] ERASE PROCEDURE

[75] Inventors: Tim M. Coffman, Sugar Land; Sung-Wei Lin; Phat C. Truong, both of Houston, all of Tex.

[73] Assignee: Texas Instruments Incorporated, Del.

[21] Appl. No.: 664,013

[22] Filed: Jun. 12, 1996

[51] Int. Cl.$^6$ ................................................ G11C 16/06
[52] U.S. Cl. ........................ 365/185.22; 365/125.12; 365/185.19; 365/185.24; 365/185.3; 365/185.33; 365/236
[58] Field of Search ................. 365/185.11, 185.12, 365/185.19, 185.22, 185.24, 185.3, 185.33, 236

[56] References Cited

U.S. PATENT DOCUMENTS 5,568,439 10/1996 Harari .................. 365/185.22

*Primary Examiner*—Joseph E. Clawson, Jr.
*Attorney, Agent, or Firm*—Theodore D. Lindgren; Leo N. Heiting; Richard L. Donaldson

[57] ABSTRACT

A procedure for erasing a Flash EPROM array (AR) includes applying a series of erase pulses to all of the subarrays (S1, S2, etc.) of a Flash EPROM array (AR) simultaneously. Between each erase pulse, the memory cells (10) of each sub array (S1, S2, etc.) are simultaneously checked one row at a time and one column position at a time, to see whether or not any cell (10) is over-erased. If, at any time during the procedure a cell (10) is found to be over-erased, the over-erased condition is corrected and the erase procedure continues, but with erase pulses applied only to those subarrays (S1, S2, etc.) having non-erased memory cells (10) as in prior-art subarray erase procedures. Under almost all circumstances, the procedure of this invention decreases over-all erase time.

21 Claims, 4 Drawing Sheets

PRIOR ART ERASE PROCEDURE FLOW CHART

५,६३६,१६२

ERASE PROCEDURE

BACKGROUND OF THE INVENTION

This invention relates generally to the field of integrated circuits and, more particularly, to an improved procedure for erasing Flash Electrically-Erasable, read-Only Memories (Flash EPROMs). The type of Flash EPROM to which this invention relates has nonvolatile memory cells formed from a single transistor, the single transistor formed without a split control gate.

Using early prior-art procedures, all of the memory cells of a nonvolatile Flash EPROM array are erased simultaneously. In many cases, the simultaneous erasure results in the over-erasure of an excessive number of memory cells. One solution to over-erasure of an excessive number of memory cells is a later prior-art procedure in which subarrays of the entire array are separately erased.

In the later prior-art procedure, erasing pulses are simultaneously applied to all of the cells in all of the subarrays of a nonvolatile Flash EPROM array. After each erasing pulse is applied, a corresponding cell, or corresponding group of cells, in each subarray is checked to see whether or not that cell, or group of cells, is erased. Upon finding that a cell, or group of cells, is erased, no further erasing pulses are automatically applied simultaneously to all of the cells in all of the subarrays. The test continues to determine whether or not corresponding individual cells, or groups of cells, in each subarray are erased. If any of the corresponding cells, or groups of cells, is found not to be erased, at least one erasing pulse is applied only to those subarrays containing the non-erased cells. At each step, the over-erased cells of each subarray are corrected and the erasing procedure continues until all of the cells are erased, but not over-erased, or until a count is exceeded.

A problem arises when using the later prior-art procedure to erase a nonvolatile Flash EPROM with many slow memory cells. Under that circumstance, the later prior-art procedure requires an excessive amount of time for completion of the erase operation.

There is a need for an improved erase procedure that includes the flexibility of erasing individual subarrays, but that decreases the amount of time required for completion of the erase operation, yet results in a narrow distribution of threshold voltages.

SUMMARY OF THE INVENTION

In accordance with the present invention, an improved erase procedure is described. The improved erase procedure includes the flexibility of erasing individual subarrays and results in a narrow distribution of threshold voltages. Under almost all circumstances, the procedure of this invention decreases over-all erase time.

The improved erase procedure includes an initial, simultaneous application of a series of erase pulses to all of the subarrays of a Flash EPROM array. Between each erase pulse, the memory cells in each subarray are simultaneously checked one column position at a time to see whether or not any cell is over-erased. If, at any time during the procedure a cell becomes over-erased, the over-erased condition is corrected, then the erase procedure continues as in the prior-art. That is, erasing pulses are simultaneously applied to all of the cells in all of the subarrays until an over-erase condition occurs, rather than until an erase condition occurs as in the prior-art. After the over-erase condition first occurs, the prior-art procedure is followed as described in the previous section. That is, the test continues to determine whether or not corresponding individual cells, or groups of cells, in each subarray are erased. If any of the corresponding cells, or groups of cells, is found not to be erased, at least one erasing pulse is applied only to those subarrays containing the non-erased cells. At each step, the over-erased cells of each subarray are corrected and the erasing procedure continues until all of the cells are erased, but not over-erased, or until a count is exceeded. As before, after each erase pulse, cells of each individual subarray are checked to see whether or not the cells of that subarray have been over-erased. At each step, the over-erased cells of each subarray are corrected and the erasing procedure continues until all cells are erased, but not over-erased, or a count is exceeded.

A technical advantage of the disclosed process is that the erased threshold voltages reach a narrow range in as little as one-third of the time required by the prior art procedure.

DETAILED DESCRIPTION OF THE INVENTION

The preferred embodiment of the present invention and its advantages are best understood by referring to FIGS. 1 through 5 of the drawings, like numerals being used for corresponding parts of the various drawings. However, it is appreciated that the present invention provides widely applicable inventive concepts, which can be embodied in a variety of specific contexts. The specific embodiment illustrates a specific way to make and use the invention without limiting the scope of the invention.

Figure 1:
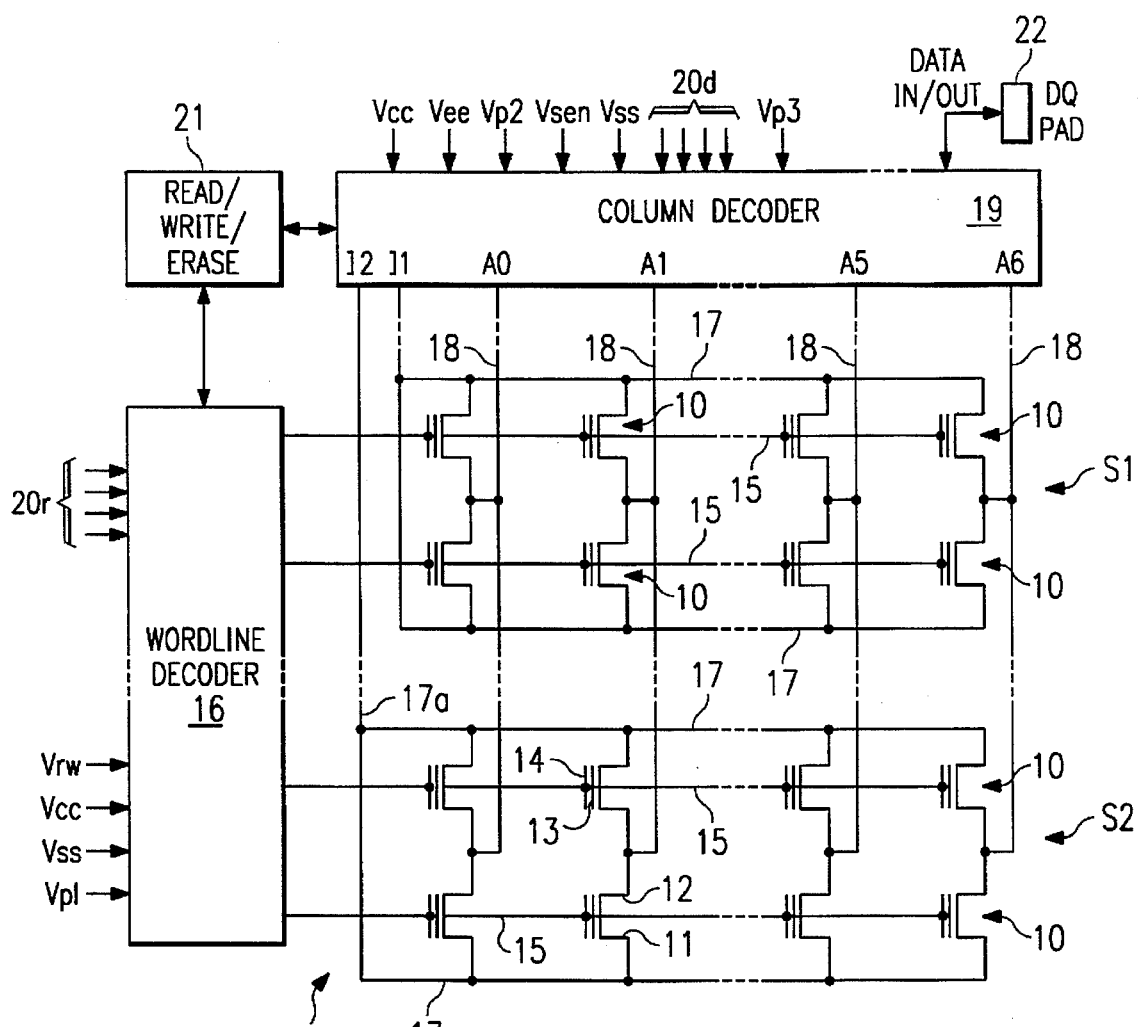
FIG. 1 is an electrical schematic diagram, in partial block form, of a nonvolatile memory cell array.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21 (or microprocessor 21), to apply a pre-selected positive voltage $V_{cc}$ b(approx. +5 V) to the selected wordline 15, and to apply a low voltage (ground or $V_{SUB}$) to deselected wordlines 15.

The column decoder 19 functions to apply a pre-selected positive voltage $V_{SEN}$ (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 may function to leave all drain-column lines 18 floating (connected to a high impedance such as field-effect transistor biased in "OFF" condition). The wordline decoder 16 functions to connect all the wordlines 15 to reference potential $V_{SUB}$, which may be ground. The column decoder 19 also functions to apply a series of high positive voltage $V_{EE}$ (approx. +10 V to +15 V) pulses to the source lines 17 of the cells (entire array or a subarray of cells) to be erased. These erasing pulses create sufficient field strength across the gate oxide region to generate a Fowler-Nordheim tunnel current that transfers charge from the floating gate 13 to the source 11, erasing the memory cell 10. Further discussion of the erasing procedure is included in later paragraphs.

In a write or program mode, the wordline decoder 16 may function, in response to wordline address signals on lines 20r and to signals from Read/Write/Erase control circuit 21, (or microprocessor 21) to place a pre-selected first programming voltage $V_{P1}$ (approx. +12 V) on a selected wordline 15, including a selected control-gate 14. Column decoder 19 also functions to place a second programming voltage $V_{P2}$ (approx. +5 to +10 V) on a selected drain-column line 18 and, therefore, the drain 12 of selected cell 10. The source lines 17 are connected to reference potential $V_{SUB}$, which may be ground. All of the deselected drain-column lines 18 are connected to reference potential $V_{SUB}$ or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with $V_{P1}$ at 0 V). For memory cells 10 fabricated in accordance with the example embodiment, the coupling coefficient between a control gate 14/wordline 15 and a floating gate 13 is approximately 0.6. Therefore, a programming voltage $V_{P1}$ of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with a positive read voltage on control gate 14, a state which is read as a "zero" bit. Deselected cells 10 have source-drain paths under the floating gate 13 that remain conductive, and those cells 10 are read as "one" bits.

Figure 2:
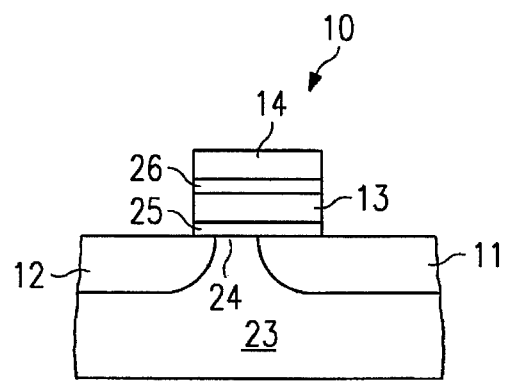
FIG. 2 is an cross-sectional view of a non-split gate memory cell of the type used with the procedure of this invention.

Referring now to FIG. 2, The Flash EPROMs, or flash arrays AR of this invention have nonvolatile memory cells 10, each cell 10 formed from a single transistor, the single transistor formed without a split control gate 14. The cell 10 is formed on a substrate 23. A channel 24 separates the diffused source 11 from the diffused drain 12. A gate insulator 25 separates the channel 24, and substrate 23, from floating gate 13. An inter-level insulator 26 separates the floating gate 13 from the control gate 14. Memory arrays AR of this type require a relatively narrow distribution of threshold voltages $V_T$ after flash erasure and before being re-programmed. That is, the threshold voltages $V_T$ should be distributed in a narrow range, the range extending from a lower limit that is a small positive value to an upper limit that is a larger positive value below the read voltage $V_{cc}$. The read voltage $V_{cc}$ (perhaps approx. +5 V) is the voltage applied to the control gates 14 of cells 10 during read operation of the array AR. As discussed previously, when the read voltage is applied to the control gate 14 of a memory cell 10, the conductivity of source-drain path is measured. The source-drain path, or channel 24, of an erased cell 10 conducts with read voltage applied, while the source-drain path 24 of a programmed cell 10 does not conduct. In the type of memory under discussion, an erased cell 10 has a floating gate 13 that is usually neutrally charged or perhaps slightly positively charged. A programmed cell 10 has a floating gate 13 that is negatively charged.

Figure 3:
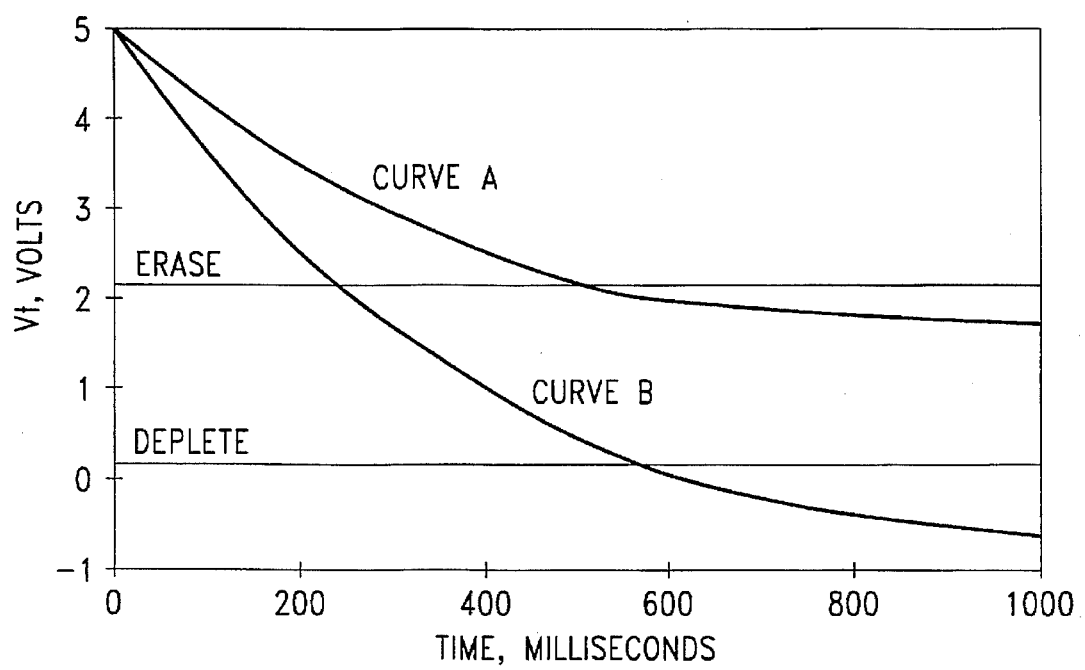
FIG. 3 is a graph of voltage threshold versus time and illustrate the characteristic of a fast-erasing memory cell and the characteristic of a slow-erasing memory cell.

Some flash memories AR have wide distributions of threshold voltages $V_T$ after flash erasure. The wide distribution may be caused, for example, by differences in oxide thickness among the cells 10 of a flash memory AR. The slowest memory cell 10 to erase (the memory cell 10 with the highest erase threshold voltage $V_T$) must have a final threshold voltage $V_T$ below the read voltage if that memory cell 10, and any parallel-connected memory cells 10, are to read correctly. The fastest memory cell 10 to erase (the memory cell 10 with the lowest erase threshold voltage $V_T$) must not erase to a threshold voltage $V_T$ so low (including negative values) such that the memory cell 10 cannot be turned off. Again, an over-erased (or depleted) memory cell 10 prevents the entire column of parallel-connected memory cells 10 in an array AR from reading correctly. FIG. 3 shows the erase threshold voltage $V_T$ versus time for a slow memory cell 10 (curve A) and for a fast memory cell 10 (curve B).

In early prior-art, all of the memory cells 10 of a nonvolatile array AR are erased simultaneously. The simultaneous erasure leads to over-erasure of an excessive number of memory cells 10, resulting in a later, also prior-art, use of separately erasable subarrays of the entire array AR.

Referring again to FIG. 1, the exemplary array AR of nonvolatile memory cells is divided into at least a first subarray S1 and a second subarray S2. A first erase input I1 is connected to the first subarray S1 and a second erase input I2 is connected to the second subarray S2. Each of the first and second subarrays S1 and S2 is separately flash erasable by applying a series of erasing pulses to its respective erase input I1 or I2. A typical array AR may comprise, for example, sixteen such subarrays S1, S2, etc., connected to sixteen such erase inputs I1, I2, etc.

Addresses A0–A6 are column addresses. Each column address A0–A6 addresses a column extending through the first and second subarrays S1 and S2. That is, the drains 12 of cells 10 of a column in the first subarray S1 are connected to the drains 12 of cells 10 of a column in the second subarray S2.

Figure 4:
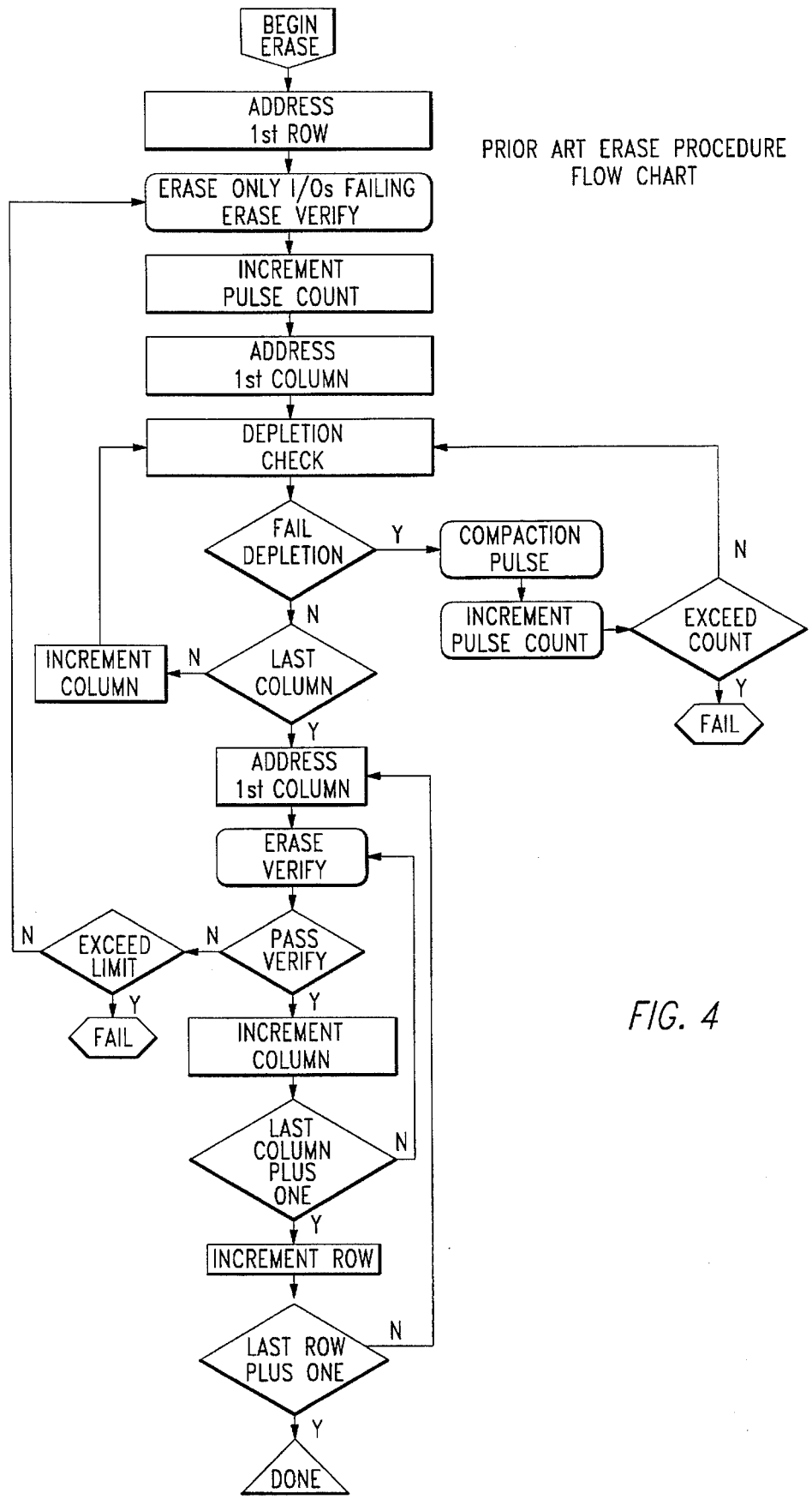
FIG. 4 is a flow chart illustrating a later prior-art erase procedure.

In the prior-art, a process referred to as compaction is used to raise the threshold voltages $V_T$ of depleted memory cells 10. One procedure for compacting the threshold voltages of memory cells 10 is described, for example, in U.S. Pat. No. 5,122,985 issued Jun. 16, 1992 to Giovanni Santin and also assigned to Texas Instruments Incorporated. The array AR is divided into smaller sections (subarrays S1, S2, etc.). Individual erase pulses are first applied to all subarrays simultaneously until at least one corresponding memory cell 10 in one of the subarrays is erased. At that point, individual erase pulses are applied only to any subarray (perhaps S1 or S2) failing an erase verify test. Using this process, the probability that both the slowest memory cell 10 and fastest memory cell 10 occur in the same subarray S1 or S2 and cause depletion is reduced. The smaller subarrays S1 and S2 improve the overall erase distribution only if a subarray S1 or S2 that is not passing the erase verify test is erased further. This erase procedure is shown in FIG. 4 entitled "Prior-Art Erase Procedure Flow Chart". This later prior-art approach works well for memory arrays AR with a single slow memory cell 10.

However, a problem results from use of the later prior-art procedure to erase an array AR having many slow memory cells 10 that cause a very wide erase distribution of threshold voltages $V_T$. Using the later prior-art procedure, all erase-verify tests are performed sequentially and simultaneously on each row of a subarray S1, S2, etc. Within each set of rows, the erase-verify test is performed one column, or address, at a time. If the initial erase-verify test indicates need for erasure, all memory cells 10 in all subarrays S1, S2 receive at least one simultaneous erase pulse. The erase-verify test is again made, and if a memory cell 10, perhaps within a group of memory cells 10, indicates need for erasure, then erasure pulses are applied only to those individual subarrays S1, S2 having non-erased cells 10. That is, in the later prior-art procedure, the cells 10 in a column (including all subarrays S1, S2, etc.) are erased by subarray, rather than by array. After each subarray column is erased, the cells within that subarray column are verified for erasure or over-erasure, then compacted if over-erased. The process is repeated by column for each row until all of the cells 10 in the array AR are erased, verified and compacted if over-erased, or until a count of number of erasure/compaction steps is exceeded.

The example of TABLE I illustrates the required number of individually applied multiple individual erase pulses needed to erase memory cells 10 in, for example, the first row of each of the two subarrays S1 and S2 of FIG. 1.

TABLE I

| | NUMBER OF PULSES REQUIRED FOR ERASE OF CERTAIN CELLS | | | | | | |
|---|---|---|---|---|---|---|---|
| Column Address | A0 | A1 | A2 | A3 | A4 | A5 | A6 |
| Cells in first row of first subarray S1 | 20 | 5 | 3 | 3 | 3 | 3 | 3 |
| Cells in first row of second subarray S2 | 2 | 2 | 2 | 15 | 15 | 15 | 15 |

However, applying the later prior-art procedure to the example of TABLE I and the array of FIG. 1 illustrate another problem. The later prior-art procedure is generally described in the flow chart of FIG. 4. As mentioned above, the array AR of FIG. 1 is divided into first and second subarrays S1 and S2 with the first subarray S1 connected to first erase input I1 and the second subarray S2 connected to second erase input I2. (In the procedures of FIG. 4 and FIG. 5, the designation I/Os corresponds to input I1 and input I2 of FIG. 1.) An erase pulse applied to erase input I1 tends to flash erase every cell 10 in first subarray S1. Similarly, an erase pulse applied to erase input I2 tends to flash erase every cell 10 in second subarray S2. Each erase pulse applied to erase inputs I1 and I2 is short enough not to over-erase the fastest cell in the array AR. Each of subarrays S1 and S2 has seven common columns connected to address inputs A0–A6. Using the later prior-art procedure, a short erase pulse is applied to the cells 10 in subarray S1. The part of the column corresponding to address A0 in the first subarray S1 is then checked to see whether or not the cells 10 in that part of the column are erased. If not, a second erase pulse is applied, and the check is repeated.

Note that if the early prior-art procedure is used and, therefore, erase pulses are applied simultaneously to both the first erase input I1 and the second erase input I2, only twenty pulses are required. However, then the second erase input I2 receives five unnecessary erase pulses, which may drive one or more of the other memory cells 10 in subarrays S1 or S2 into a depleted state.

Using the example of TABLE I, and the prior-art procedure of FIG. 4, twenty consecutive erasing pulses are applied at the first erase input I1 to erase the first-row cell in the part of the A0 column in first subarray S1. To erase the first-row memory cell 10 in the part of the same column corresponding to address A0 but in the second subarray S2, two consecutive erasing pulses are applied at the second erase input I2. After application of twenty consecutive erasing pulses at the first erase input I1 and two consecutive erasing pulses at the second erase input I2, the erase verify test indicates successful erase of the subarray first row cells in the column defined by address A0. The erase verify test then increments to address A1, then address A2, etc. Addresses A1 and A3 do not require application of additional erasing pulses at either the first erase input I1 or the second erase input I2 because those inputs require application of a number of erasing pulses less than or equal to the number of erase pulses previously applied to the first and second erase inputs I1 and I2. Address A3 does not require application of erase pulses to the first erase input I1. However, address A3 requires that thirteen additional consecutive erasing pulses be applied at the second erase input I2. The remaining addresses A4–A6 do not require additional erase pulses. The cumulative number of erase pulses required to erase the first rows of subarrays S1 and S2 with this method is 33 (the sum of 20 and 13).

The process of testing rows of subarrays in parallel and of individually applying erasing pulses to subarrays continues until all of the rows of all of the subarrays S1, S2, etc. pass the verification test.

An improvement to the later prior-art procedure is illustrated by modification of the erase procedure of FIG. 4 to the erase procedure shown in FIG. 5, entitled "Improved Erase Procedure Flow Chart." The procedure of FIG. 5 includes a flag FL that is not a part of FIG. 4. The flag FL is initially clear, and is set when any depletion test fails. The erase pulse segment of the procedure is conditional on this flag FL. If the flag FL is not set, all subarrays S1, S2, etc., are erased in parallel. Once any of the subarrays S1, S2, etc., fails depletion check, the flag FL is set. Ensuing erase pulses are applied only to the particular subarray S1, S2, etc., that fails the erase verify test. In the preceding example of TABLE I, if twenty pulses applied to the second erase input I2 does not deplete any cells 10 in either first row of subarray S1 or S2, the cumulative erase time is only twenty pulses total. However, if on the thirteenth pulse applied to both the first erase input I1 and the second erase input I2, a cell 10 at address A1 or A2 of subarray S1 or at any of addresses A2-A6 of subarray S2 fails the depletion test, then seven additional pulses at input I1 are needed to erase the cell 10 at address A0 of subarray S1. In addition, two additional pulses are needed at input I2 to erase the cell at address A3 to complete erasure. This yields a total of twenty-two pulses to erase the first rows of subarrays S1 and S2. This solution provides improved erase time for the array AR without excessive over-erase.

Figure 5:
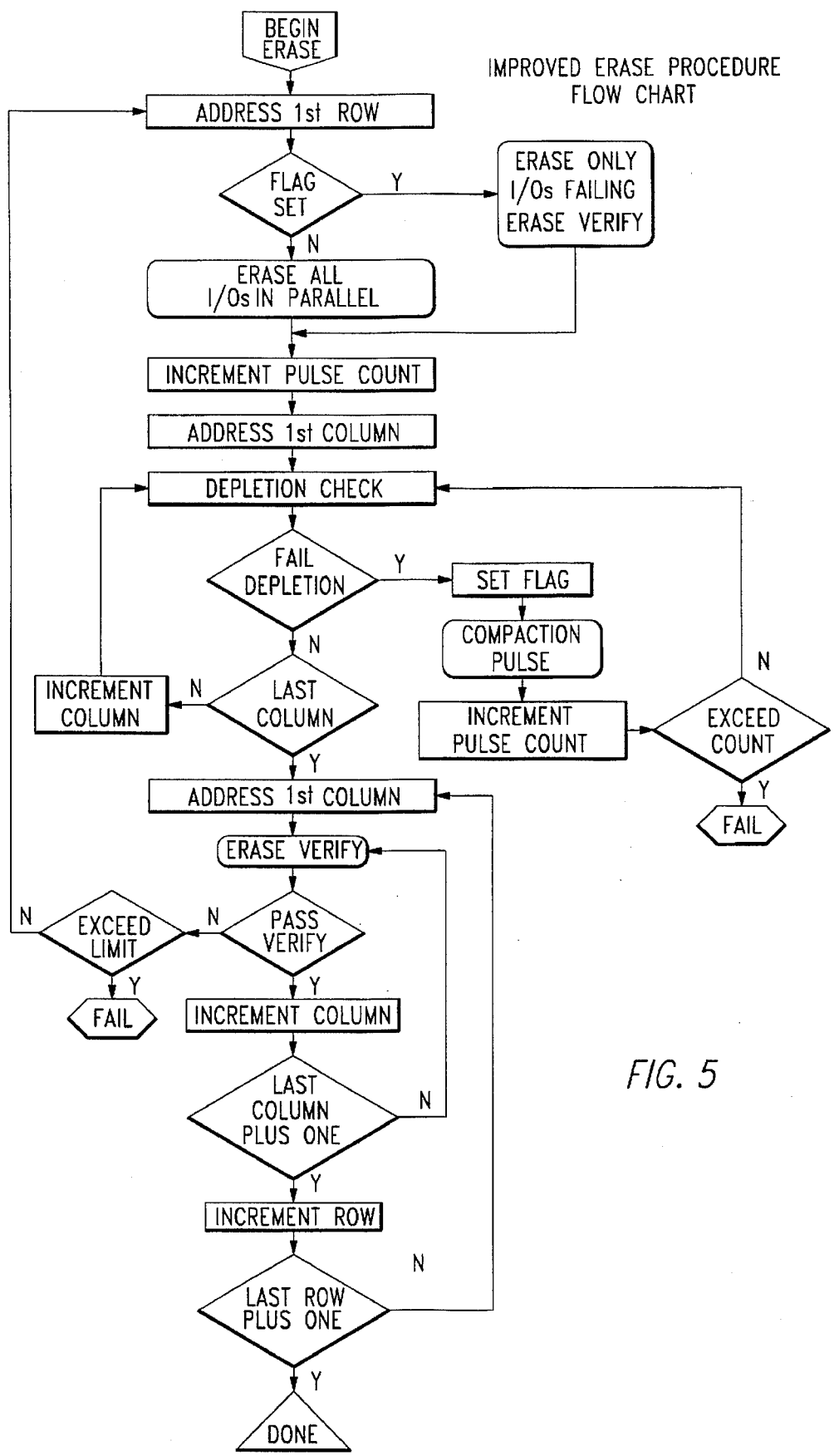
FIG. 5 is a flow chart illustrating the erase procedure of this invention.

It is possible that, when using the procedure of FIG. 5 to erase the example of TABLE I, twenty erasing pulses applied to both the first and the second subarrays S1 and S2 will not over-erase any of the cells 10 of the array AR. If that is the case, then only twenty pulses are needed rather than the twenty-two of the immediately preceding example.

Using the procedure of this invention, the array AR is divided into a group of subarrays S1, S2, etc., then the erase operation is performed on all of the subarrays S1, S2, etc. in parallel until an over-erased condition (depletion) occurs, or until all of the cells are erased, whichever occurs first. A unique feature of the procedure of this invention that, if an over-erased condition occurs, then the erase operation continues on subarrays S1, S2, etc., individually, such that only those subarrays S1, S2, etc., failing an erase-verify test receive erase pulses.

In the foregoing paragraph, the depletion check step normally checks for substantial current conduction between source 11 and drain 12 of depleted memory cells 10 with low voltage applied to the control gate 14. If desired, the depletion check may check for very small current conduction between source 11 and drain 12 of depleted memory cells 10 with low voltage applied to the control gate 14. Using the small current standard, actual over-erasure, or depletion, is prevented. Therefore, the time required to correct the over-erasure condition is saved, but with creation of other problems.

The advantage of the procedure of this invention is a shorter erase time while maintaining an over-erase margin.

As an alternative, the memory cells 10 may be checked to see whether or not they are erased before checking for over-erasure. A disadvantage of this reverse-order procedure is that over-erased cells adversely affect the ability to test parallel-connected cells for erasure.

While the invention has been described with reference to illustrative embodiments, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

What is claimed is:

1. A procedure for erasing a nonvolatile memory array having at least a first and a second subarray of memory cells, said memory cells in said first subarray being separately flash erasable and said memory cells in said second subarray being separately flash erasable, said procedure comprising:
   (a) simultaneously applying at least a flash erase pulse to said first subarray and said second subarray;
   (b) testing said memory to determine the depletion condition of any memory cell in said memory, said depletion testing performed by simultaneously checking one column of memory cells per said subarray at a time;
   (c) if any memory cell in said memory is depleted, correcting the depletion condition;
   (d) testing to determine whether any memory cell in said memory is not erased, said testing performed by simultaneously checking one memory cell per said subarray at a time;
   (e) if any memory cell in said first subarray is over-erased and corrected, and if any memory cell in said first subarray is not erased, applying another flash erasing pulse only to said first subarray; and
   (f) if any memory cell in said first subarray is depleted and corrected, and if any memory cell in said second subarray is not erased, applying another flash erasing pulse only to said second subarray.

2. The procedure of claim 1, further including after step (d) and before steps (e) and (f) the following step:
   if any memory cell in said first subarray is depleted and corrected, and if any memory cell in said first subarray is not erased and if any memory cell in said second subarray is not erased, simultaneously applying another flash erasing pulse to said first and second subarray.

3. The procedure of claim 1, further including, after application of a said another erasing pulse, checking the depletion condition of said memory cells in a said subarray.

4. The procedure of claim 1, further including, after application of a said another erasing pulse, checking the depletion condition of said memory cells in a said subarray, wherein if a said memory cell is depleted, correcting the depleted condition.

5. The procedure of claim 1, further including, after application of a said another erasing pulse, checking the depletion condition of said memory cells in a said subarray, wherein if a said memory cell is depleted, correcting the depleted condition, and further including checking to determine if any of said memory cells in said subarray is not erased.

6. The procedure of claim 1, further including, after application of a said another erasing pulse, checking the depletion condition of said memory cells in a said subarray, and further including checking to determine if any of said memory cells in said subarray is not erased.

7. The procedure of claim 1, wherein said depletion condition checks is very small current conduction between the source and drain of said memory cells with low voltage applied to the control gates of said memory cells, said small current indicating no actual depletion of said memory cells.

8. The procedure of claim 1, wherein said nonvolatile memory array includes one-transistor memory cells without split control gates.

9. A procedure for erasing a flash EPROM having multiple separately flash erasable subarrays of memory cells, said procedure comprising:
   (a) simultaneously applying at least a flash erase pulse to each said flash erasable subarray;
   (b) testing said flash EPROM to determine whether any memory cell in said flash EPROM is depleted, said depletion testing performed by simultaneously checking one column of memory cells per said subarray at a time;
   (c) if any memory cell in said flash EPROM is depleted, correcting the depleted condition;
   (d) testing said flash EPROM to determine whether any memory cell in said flash EPROM is not erased, said testing performed by simultaneously checking one memory cell per said subarray at a time; and
   (e) if memory cells in said flash EPROM are not erased, applying another flash erasing pulse to only those subarrays in which said not-erased memory cells are located.

10. The procedure of claim 9, further including, after application of said another erasing pulse, checking one or more of said memory cells in that subarray for depletion.

11. The procedure of claim 9, further including, after application of said another erasing pulse, checking one or more of said memory cells in that subarray for depletion, wherein if a said memory cell is depleted, correcting the depleted condition.

12. The procedure of claim 9, further including, after application of said another erasing pulse, checking one or more of said memory cells in that subarray for depletion, wherein if a said memory cell is depleted, correcting that depletion, and further including checking to determine if any of said memory cells in that subarray is not erased.

13. The procedure of claim 9, further including, after application of said another erasing pulse, checking one or more of said memory cells in that subarray for depletion, and further including checking to determine if any of said memory cells in that subarray is not erased.

14. The procedure of claim 9, wherein said check for depletion checks for very small current conduction between the source and drain of said memory cells with low voltage applied to the control gates of said memory cells, said small current indicating no actual depletion of said memory cells.

15. The procedure of claim 9, wherein said nonvolatile memory array includes one-transistor memory cells without split control gates.

16. A procedure for erasing a flash EPROM having multiple separately flash erasable subarrays of memory cells, said procedure comprising:

(a) simultaneously applying at least a flash erase pulse to each said flash erasable subarray;

(b) testing said flash EPROM to determine whether any memory cell in said flash EPROM is not erased, said testing performed by simultaneously checking one memory cell per said subarray at a time;

(c) testing said flash EPROM to determine whether any memory cell in said flash EPROM is over-erased, said testing performed by simultaneously checking one column of memory cells per said subarray at a time;

(d) if any memory cell in said flash EPROM is over-erased, correcting the overerased condition; and (e) if any of the memory cells in said flash EPROM is not erased, applying another flash erasing pulse only to subarrays in which said any not-erased memory cell are located.

17. The procedure of claim 16, further including checking after application of said another erasing pulse to determine the depletion condition of one or more of said memory cells in that subarray.

18. The procedure of claim 16, further including checking after application of said another erasing pulse to see whether one or more of said memory cells in that subarray is depleted, wherein if a said memory cell is depleted, correcting the depleted condition.

19. The procedure of claim 16, further including checking after application of said another erasing pulse to see whether one or more of said memory cells in that subarray is depleted, wherein if a said memory cell is depleted, correcting the depleted condition, and further including checking to determine if any said memory cells in that subarray is not erased.

20. The procedure of claim 16, further including checking after application of said another erasing pulse to see whether one or more of said memory cells in that subarray is depleted, and further including checking to determine if any said memory cells in that subarray is not erased.

21. The procedure of claim 16, wherein said nonvolatile memory array includes one-transistor memory cells without split control gates.

* * * * *